Oct. 29, 1963 H. D. MORRIS ET AL 3,109,145

STABLE ZERO ELECTRONIC CIRCUITRY

Filed April 27, 1960 4 Sheets-Sheet 1

HAROLD D. MORRIS &
JOSEPH T. BUCKINGHAM
INVENTORS

BY Flehr and Swain
ATTORNEYS

Oct. 29, 1963 H. D. MORRIS ET AL 3,109,145

STABLE ZERO ELECTRONIC CIRCUITRY

Filed April 27, 1960 4 Sheets-Sheet 2

HAROLD D. MORRIS &
JOSEPH T. BUCKINGHAM
INVENTORS

BY Flehr and Swain
ATTORNEYS

Oct. 29, 1963 H. D. MORRIS ET AL 3,109,145

STABLE ZERO ELECTRONIC CIRCUITRY

Filed April 27, 1960 4 Sheets-Sheet 3

HAROLD D. MORRIS &
JOSEPH T. BUCKINGHAM
INVENTOR.

BY Flehr and Swain
ATTORNEYS

HAROLD D. MORRIS &
JOSEPH T. BUCKINGHAM
INVENTORS

BY Flehr and Swain
ATTORNEYS 3,109,145

STABLE ZERO ELECTRONIC CIRCUITRY

Harold D. Morris, Pleasant Hills, and Joseph T. Buckingham, Concord, Calif., assignors, by mesne assignments, to Systron-Donner Corporation, Concord, Calif., a corporation of California Filed Apr. 27, 1960, Ser. No. 25,116
9 Claims. (Cl. 323—1)

This invention relates to stable-zero electronic circuitry and more particularly to such stable-zero electronic circuitry for use in accelerometers.

Difficulty has been experienced with circuitry heretofore provided for accelerometers such as the circuitry disclosed in copending application Serial No. 794,487, filed February 4, 1959, because of the change in the zero spacing of the position of the pickoff as a function of temperature. It has been found that in such circuitry the zero shifted because the oscillator in the circuitry oscillates at a point which is determined by the gain of the amplifier in the circuitry and the amount of feedback to the oscillator as well as other reasons. For example, there is a substantial change in the zero position of the paddle because of temperature changes which primarily affect the vacuum tubes and transistors utilized in the circuitry. As is well known to those skilled in the art, the beta gain of transistors is particularly influenced by temperature changes. Thus, if for any reason the output of the oscillator is less, it is necessary for the paddle to move in order to obtain the same output from the oscillator. This, therefore, represents a change in the steady state position of the paddle which reflects itself in an accelerometer as a change in the zero output or the sensing axis. There is, therefore, a great need for stable-zero electronic circuitry.

In general, it is an object of the present invention to provide electronic circuitry which has a stable electrical zero throughout a wide temperature range.

Another object of the invention is to provide electronic circuitry of the above character which when used with an accelerometer will provide a stable axis of sensitivity for the accelerometer throughout wide temperature ranges.

Another object of the invention is to provide electronic circuitry of the above character in which a single oscillator is used.

Another object of the invention is to provide electronic circuitry of the above character in which means is provided for regulating the level at which the oscillator oscillates.

Another object of the invention is to provide electronic circuitry of the above character in which the output of the circuitry is essentially zero when the paddle is in a mid-point position between two pickoffs, for wide temperature ranges.

Another object of the invention is to provide electronic circuitry of the above character in which symmetrical pickoffs and symmetrical connecting circuitry are utilized.

Another object of the invention is to provide electronic circuitry of the above character in which the differences between the outputs of the two symmetrical sides of the circuitry are utilized as the useful output from the electronic circuitry.

Additional objects and features of the invention will appear from the following description in which the preferred embodiment has been set forth in detail in conjunction with the accompanying drawings.

Referring to the drawings.

Figures 1, 2:
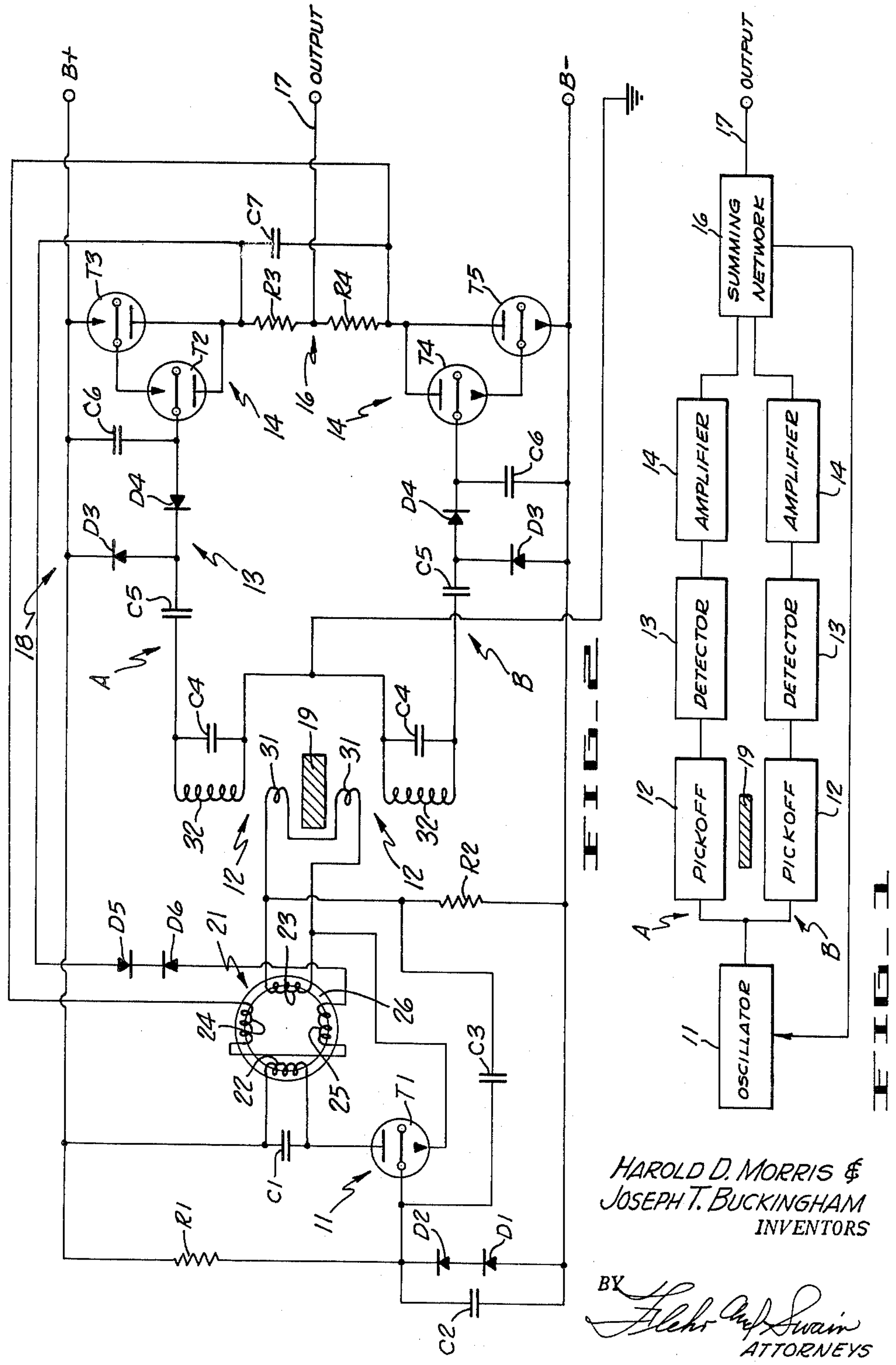
FIGURE 1 is a block diagram of the electronic circuitry incorporating our present invention.
FIGURE 2 is a detailed circuit diagram of the electronic circuitry incorporating our invention.

In general, our electronic circuitry consists of an oscillator and a pair of spaced pickoffs which are fed by the oscillator. A moving element is disposed between the pickoffs and is movable between the pickoffs to modify the fields between the pickoffs. Movement of the paddle serves to vary the outputs from the pickoffs. Detecting means detects the output of each of the pickoffs. Summing means is connected to each of the pickoffs for algebraic summing of outputs from the detecting means. Negative feedback means is connected to the summing means and to the oscillator to regulate the level of oscillation of the oscillator to thereby maintain the output of the summing means at a constant level when the paddle is in a predetermined position with respect to said pair of pickoffs. Our electronic circuitry, as shown in block diagram form in FIGURE 1, consists of an oscillator 11 which drives two separate channels, channel A and channel B. Each of the channels consists of a pickoff 12, the output of which is supplied to a detector 13 and amplified by an amplifier 14. The outputs of the two channels are connected into a summing network 16 which is connected to an output terminal 17. A negative feedback circuit 18 is connected between the summing network 16 and the oscillator 11.

From the block diagram, it can be seen that the oscillator drives the pickoffs 12 in both channels. The pickoffs need not be, but preferably are of the resonant type described in our copending application Serial No. 794,487, filed February 4, 1959. The two amplifiers 14 are of a complementary nature so that their drift characteristics are subtractive. This is advantageous because this causes cancellation in the summing network 16 of any change in the amplifiers which is of a type likely to affect both amplifiers in the same fashion. Essentially, the two pickoffs are driving two channels that are subtracted in the output.

A moving element in the form of a paddle 19 is mounted between the two pickoffs 12 and is movable between the two pick-offs to modify the field between the pickoffs. The output is normally adjusted so that it is zero when the paddle 19 is in a mid-point position between the two pickoffs. If the paddle 19 is moved so that it is closer to the pickoff in channel A, it will reduce the output from that pickoff and increase the output of the pickoff in channel B to provide a differential output at 17 which will be either negative or positive depending on which way the paddle is moved.

The feedback circuit 18 provides a closed loop which causes the oscillator 11 to operate at a level which is necessary in order to maintain the desired output from the circuitry. This means that the same output or effort will be available from the circuitry as the paddle 19 moves back and forth between the two pickoffs regardless of the temperature at which the circuitry is operating. For example, when the amplifiers 14 are operating at high gain, the output of the oscillator will be reduced until the output at 17 is of the proper amplitude. In the same way as the gains of the amplifiers 14 drop for any reason, as for example, because of low temperatures, the amplitude of the oscillator will rise until there is sufficient output from the amplifiers to provide the desired output.

A detailed circuit diagram incorporating our invention is shown in FIGURE 2 in which the oscillator is of the transistor type and includes a transistor T1 which has a tank circuit and a feedback circuit. A transformer 21 is also provided and has four windings 22, 23, 24 and 25. The windings, as shown, are wound on a toroidal core 26.

The winding 22 of the transformer 21 and the capacitor C1 form the tank circuit for the oscillator and are connected to the collector of the transistor T1. The B— and B+ power supplies are connected to a pair of Zener diodes D1 and D2 and a resistor R1, and serve to provide a reference voltage supply for the base of the transistor T1. The capacitor C2 connected across the diodes D1 and D2 serves as a filter.

The frequency of the oscillator is primarily determined by the coil 22 and the capacitor C1, and their values are chosen so that the oscillator operates at a desired frequency. The exact frequency of oscillation of the oscillator is not important. However, it is preferable that the oscillator operate at a frequency of approximately 2 megacycles per second.

The feedback for the oscillator is provided by the winding 23 which is connected between the emitter of the transistor T1 and the base of the transistor through a coupling capacitor C3. A resistor R2 connects the emitter to the B— power supply and serves to provide the collector current for the oscillator. This resistance is chosen so that the transistor has enough gain to oscillate due to the feedback from the winding 22 provided by the winding 23.

Each of the pickoffs 12 is symmetrical and consists of two windings 31 and 32 which preferably are wound so that the paddle or vane 19 has the most effect upon the coils. For that reason, it is generally preferable to wind the pickoffs so that the coils 31 and 32 are coaxial and lie in generally the same plane as, for example, in the form of pancake-type coils. As shown, the two windings 31 of the pickoffs are serially connected and are fed by the winding 23 of the transformer 21. Although the serial connection is not absolutely necessary, it helps to give a slight increase in gain in the circuitry because when one pickoff is loaded due to paddle movement, the signal in the other pickoff is increased. This gives a differential effect and is additive when you move the paddle 19 toward one of the pickoffs and away from the other.

A capacitor C4 is connected across each of the windings 32 and serves to provide a tuned circuit for a purpose hereinafter described. It should be pointed out that both of the pickoffs 12 are identical. One side of each of the windings 32 is connected to ground as shown. A portion of the output of each of the pickoffs is fed through a coupling capacitor C5 to the detectors 13. Each detector 13 consists of diodes D3 and D4. A capacitor C6 is provided across each pair of diodes and serves as an RF filter. The outputs of the diodes are supplied to the amplifiers 14 which are similar.

The amplifier 14 in the upper channel, or A channel, can be called a "pull-up" amplifier. It is formed of transistors T2 and T3 of the P-N-P type. When current is fed to the detector in channel A, current flows through the load to the B+ supply. Two such transistors are provided so that there is adequate gain. The amplifier 14 in the lower channel, or B channel, can be called a "pull-down" amplifier. It is formed of transistors T4 and T5 of the N-P-N type. When current is fed to the detector in channel B, current flows through the load to the B— supply.

In constructing the amplifiers, each pair of transistors is chosen so that they are identical and then each pair of transistors is matched to the other pair so that they have the same beta characteristics with respect to temperature.

The output current from the amplifiers 14 flows into the summing network 16 which consists of serially connected resistors R3 and R4 with a capacitor C7 connected across them. The total current in each of the resistors R3 and R4 provides a total voltage which is fed back to the serially connected windings 24 and 25 on the toroidal core 26 through the Zener diodes D5 and D6, and is utilized for regulating the output of the oscillator as hereinafter described. The differential output from the summing network is supplied from a junction between the resistors R3 and R4 to the output terminal 17.

Operation of the electronic circuitry shown in FIGURE 2 may be briefly described as follows. The oscillator 11 operates in a more or less conventional manner in which the frequency of the oscillator as hereinbefore described is determined by the value of the capacitor C1 and the winding 22. Feedback for continuing oscillation is provided by the winding 23. The pickoffs 12 are of the resonant type described in our copending application Serial No. 794,487, filed February 4, 1959, in which movement of the paddle 19 towards one of the pickoffs modifies or destroys the coupling between the coils or windings 31 and 32 and loads the coil 32. The primary effect, however, as described in our copending application, is the detuning of the tuned circuit consisting of the winding 32 and the capacitor C4.

In utilizing the resonant pickoff with our stable-zero electronics, it was found that the best results were obtained by tuning the pickoff so that the output from the pickoff was at a maximum when the paddle or vane was adjacent the other pickoff. This, in effect, is tuning the resonant pickoff for the maximum possible spacing of the paddle 19 from the pickoff and then normally operating the pickoff at a point which is equidistant between the two pickoffs.

When the paddle 19 is in the mid-point position, the output from each of the pickoffs to the detectors should be equal and this equal output is supplied to the amplifiers 14, the output of which is applied to the summing network 16. The summing network gives us the difference between the currents flowing in the transistors in the upper and lower amplifiers and which if equal, gives an output which is zero. When the paddle 19 is moved towards the upper pickoff 12, the current flowing in the detector and the amplifier in channel A is reduced which decreases the positive current flow to give a negative output at the output terminal 17. Conversely, when he paddle 19 is moved towards the lower pickoff 12, a positive output is provided at the terminal 17.

When something occurs to change the output of the amplifiers as, for example, if the temperature is increased and the beta of the amplifier transistors rises, additional output current will flow through the resistors R3 and R4 which will be applied through the feedback circuit 18 to the windings 24 and 25 which, in turn, will cause a decrease in the feedback from the collector circuit of the oscillator to the emitter to cause the oscillator to operate at a lower level. The overall effect is, therefore, the same as a negative feedback circuit which tends to maintain the same total current flow in the output.

The resonant pickoffs have made it possible to obtain sufficient signal strength even though relatively wide paddle spacings are utilized and also to permit reduction in the signal to noise ratio in the output of the detector.

If, for some reason, the oscillator should suddenly operate at a level higher than it normally has been operating, then the current in both of the amplifiers would also increase in a proportionate amount. The voltage developed across the resistors R3 and R4 would accordingly be increased which would be applied across the windings 24 and 25 to cut down on the amplitude of oscillation of the oscillator by reducing the feedback to the oscillator.

The feedback circuit 18, however, is not effective for very small voltages because the diodes D5 and D6 do not begin conducting until a predetermined voltage is placed across the same. Thus, until this predetermined voltage is created by the resistors R3 and R4, nothing will happen to prevent the oscillator from increasing its amplitude until this predetermined voltage has been developed. However, as soon as this predetermined voltage has been reached, one of the diodes begins conducting, causing current to flow in the windings 24 and 25 to create losses which become greater and greater as the amplitude of the oscillator rises until the oscillator can no longer increase its amplitude. Thus, the feedback circuit acts as a shunt regulator type of control in which the oscillator is almost unloaded until the control point is reached, after which the control or regulator windings 24 and 25 throw in a heavier and heavier load on the oscillator until the oscillator stops rising in output voltage.

In the same manner, if the characteristics of the amplifiers 14 change so that they are putting out substantially less than they were previously putting out for the same amount of drive, the voltage across the resistors R3 and R4 would again drop and one of the diodes D5 and D6 would no longer conduct and the load would drop off of the transistor oscillator and the amplitude of the oscillator would begin rising until there was sufficient current flowing in the two amplifiers to drive the resistors R3 and R4 up to the same total voltage again. Thus, we have in essence a closed loop which causes the oscillator to continuously run at a level which is necessary to give the proper output current in the output stage. This means that there will always be the same effort available as the conducting plane 19 moves back and forth in order to differentially affect the amplifiers. There is also the same effort available in the output circuit no matter what the temperature at which the circuitry is operating because the oscillator, when the amplifiers are operating at high gain, will reduce the amplitude until the current is proper. When the gain of the amplifiers decreases, the oscillator amplitude will rise until there is sufficient output current.

By way of example, one electronic circuit constructed in accordance with the following description had the following components and values:

Transistors:
- T1—Type 2N117
- T2 and T3—Type 2N328A
- T4 and T5—Type 2N620

Transformer 21:
- Winding 22—30 turns
- Winding 23—5 turns
- Windings 24 and 25—10 turns each
- Core 26—Micrometals Type T50–2

Resistors:
- R1—22K
- R2—4.2K
- R3 and R4—820 ohms

Capacitors:
- C1—500 microfarads
- C2—.01 microfarad
- C3—.005 microfarad
- C4—330 microfarads
- C5—220 microfarads
- C6—.001 microfarad
- C7—.22 microfarad Diodes:
- D1 and D2—Type 1N755
- D3 and D4—Type 1N625
- D5 and D6—Type 1N754

Figure 3:
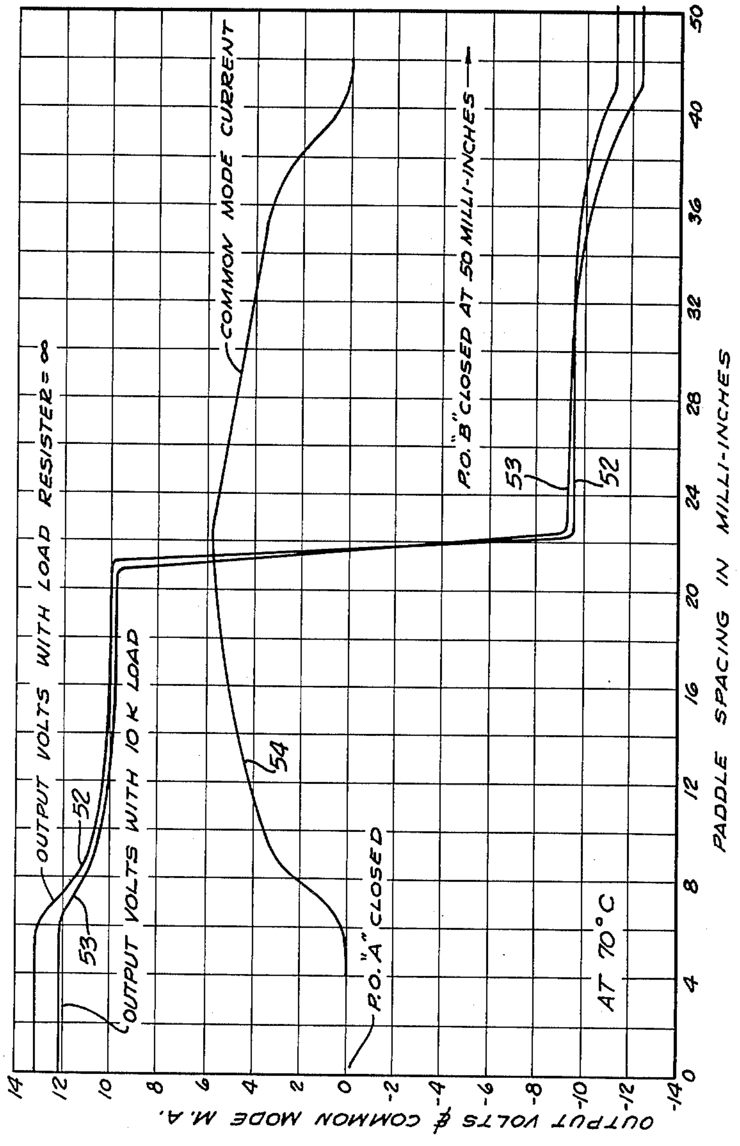
FIGURES 3, 4 and 5 are graphs showing output characteristics of the circuitry shown in FIGURE 2 at 70° C., 25° C., and −20° C., respectively.
Figure 4:
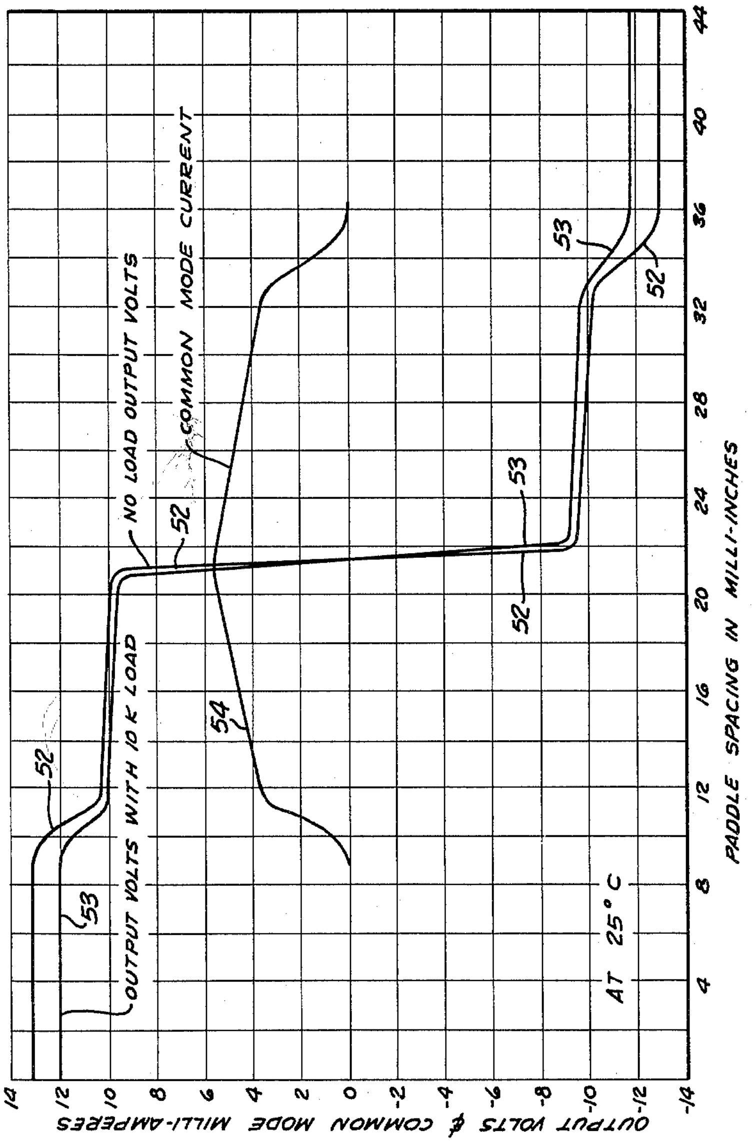
Figure 5:
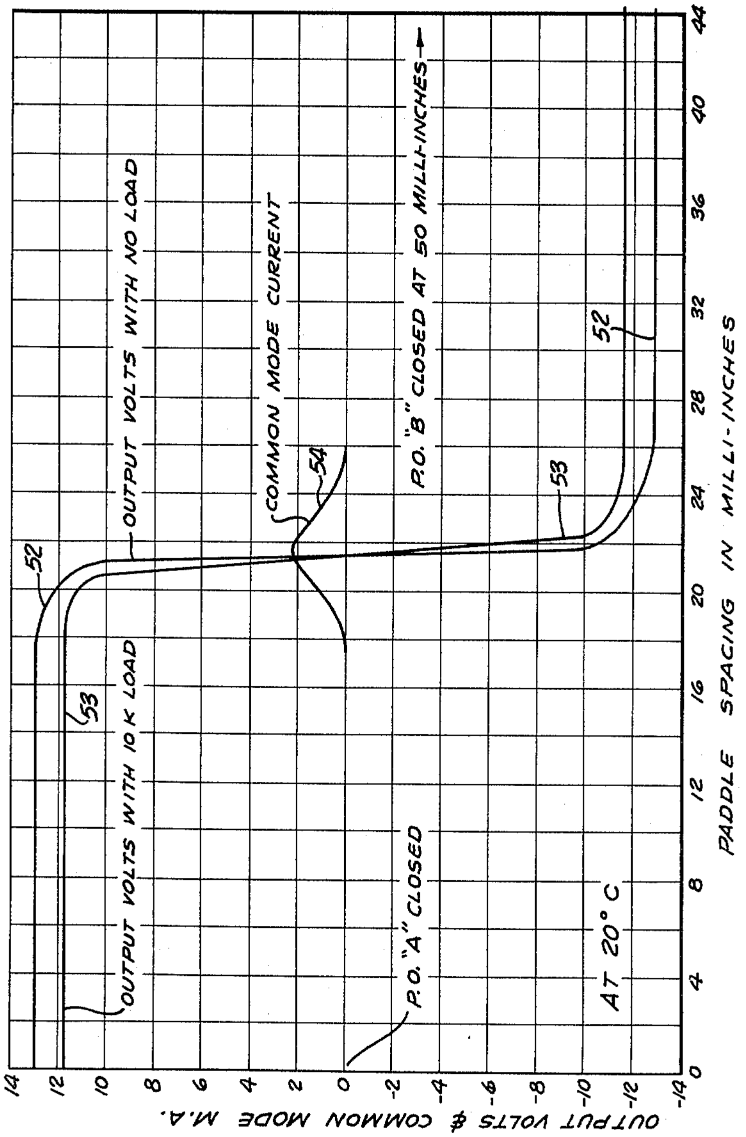

This electronic circuitry was found to operate very satisfactorily and output characteristics thereof are shown in FIGURES 3, 4 and 5. In these figures, the common-mode current and the output voltage are plotted as a function of paddle spacing, that is, the paddle distance from pickoff A. The common-mode current was measured at the junction of the resistors R3 and R4 at no load. The pickoffs A and B had a spacing of 50 milli-inches so that when the paddle was adjacent the pickoff A, there was a spacing of 50 milli-inches between the paddle and the pickoff B. Thus, at the zero position, the paddle was adjacent the pickoff A. With the paddle in this position, the output voltage at no load is shown by the curve 52 and with a 10K load is shown by the curve 53. At the zero paddle position, the output at no load was slightly over 13 volts, and with a 10K load was approximately 12 volts. It will be noted in FIGURE 4 that the voltage follows approximately a straight line until the paddle has been moved about 9 milli-inches from pickoff A, at which time there is sufficient current flow through the pickoff A that a common-mode current shown by the curve 54 begins to appear. At this point, it will be noted that the output voltage begins to drop rather rapidly and that the common-mode current increases rather rapidly, up to approximately a paddle spacing of 11¼ to 11½ milli-inches. After that, the output voltage is substantially flat and the common-mode current only increases gradually up to approximately 21½ milli-inch spacing. This transistion at the 11¼ to the 11½ milli-inches indicates that at this point the voltage generated across the resistors R3 and R4 was sufficient to overcome the voltage drop across the Zener diode to permit the regulator circuit to take over to control the output of the oscillator.

The common-mode current thereafter does not continue to increase at such a rapid rate because of the influence of this feedback circuit. The common-mode current continues to increase gradually because the regulator circuit has a finite gain. At a spacing of approximately 20 milli-inches, a point is reached where the currents in both channels A and B are substantially equal. At this point we are reaching the normal operating range of the electronic circuit, that is, with the paddle in a mid-point position between the two pickoffs. In this region, it will be noted that the output voltage in either a loaded or unloaded condition drops from approximately +10 volts to a −9.5 volts. To obtain this great range in output voltage, it is only necessary for the paddle to move approximately one milli-inch. During this time, it will be noted that the common-mode current is substantially flat and is maintained so by the regulating feedback circuit. As the paddle is moved towards the pickoff B, output curves and common-mode current curves very similar to those produced when moving from the pickoff A to the mid-point position are produced. Although the common-mode current produces a bell-shaped curve, it is only the very central portion which is flat and of particular interest because it is the normal operating range for the circuitry.

The curves shown in FIGURE 4 were obtained when the electronic circuitry was at 25° C. or room temperature. Tests were also conducted at other temperatures. In FIGURE 3 are shown the curves for a test conducted at 70° C., and in FIGURE 5, the curves for a test conducted at −20° C. In each of these figures it will be noted that the paddle was at approximately the same position—21.5 milli-inches from pickoff A for zero signal. This clearly indicates that our electronic circuitry provides a stable zero in that the zero position for the paddle is at the same position between the pickoffs regardless of the temperature at which the circuitry is operating. The figures show that the paddle spacing for zero output at the various temperatures varied at most only a fraction of a milli-inch.

From the curves, it will be noted that the common-mode current changed more significantly at the different temperatures. This was due primarily to the beta change in the transistors caused by the temperature changes. At a very cold temperature, such as at −20° C., the beta of the transistors dropped to a low value so that regulation was more difficult. Substantial regulation, however, was still taking place and the full output range was being provided.

It is apparent from the foregoing that we have provided a new and improved electronic circuitry which makes it possible to obtain a stable zero through wide ranges of temperature. As pointed out previously, this is particularly important in certain applications as, for example, for use with accelerometers where it is desirable to maintain a stable axis of sensitivity and a stable zero output for the accelerometers.

We claim:

1. In electronic circuitry of the character described, two channels each consisting of a pickoff and a detector, common oscillator means feeding the pickoff of each of the channels, means for summing the output of the channels, and feedback means connecting the summing means to the oscillator means to regulate the output from the electronic circuitry.

2. Circuitry as in claim 1 wherein said pickoffs are spaced apart a predetermined distance and wherein a moving element is disposed between the pickoffs and is movable from one pickoff to the other to modify the field between the pickoffs.

3. In electronic circuitry of the character described, a pair of channels, each channel consisting of a pickoff, a detector connected to said pickoff and a D.-C. amplifier connected to said detector, said pickoffs being spaced apart a predetermined distance, a moving element disposed between the pair of pickoffs and movable between the same to modify the field between the pickoffs, a common oscillator for driving said pickoffs, said moving element serving to vary the output from the pickoffs as the moving element is moved between the pickoffs, means for summing the outputs of the channels, and feedback means measuring the summed output of the channels and supplying a portion of the summed output to said oscillator to maintain constant output capability of the circuitry.

4. Electronic circuitry as in claim 3 wherein said pickoff is of the resonant type.

5. In electronic circuitry of the character described, a pair of spaced pickoffs, a moving element disposed between the pickoffs and movable between the same, a single common oscillator driving the pair of pickoffs, detector means connected to each of the pickoffs, D.-C. amplifier means connected to each of the detectors, summing means for summing the outputs of the amplifiers, feedback means for measuring the summed output from both amplifiers and connected to the oscillator to maintain constant output capability of the circuitry.

6. In electronic circuitry of the character described, a pair of spaced pickoffs, each of the pickoffs having at least two windings, common oscillator means for driving one of the windings of each of the pickoffs, a moving element disposed between the pickoffs and movable between the same, detector means connected to the other winding of each of the pickoffs, D.-C. amplifier means connected to each of the detector means, means for summing the output of the D.-C. amplifier means, and means for measuring the summed output of the amplifier means and feeding the same back to the oscillator to regulate the output capability of the circuitry.

7. Electronic circuitry as in claim 6 wherein a capacitor is connected across the said other winding of each of the pickoffs to provide a tuned circuit.

8. In electronic circuitry of the character described, a transformer having first, second, third and fourth windings, an oscillator including a tank circuit and a feedback circuit, the first winding of the transformer being connected into the tank circuit of the oscillator, the second winding of the transformer being connected into the feedback circuit of the oscillator, a pair of spaced pickoffs, each of the pickoffs having at least a driving winding and an output winding, means connecting the third winding of the transformer to the driving winding of each of the pickoffs, a moving element disposed between the pickoffs and movable between the same, detector means connected to each of the output windings of the pickoffs, amplifier means connected to each of the detector means, means for summing the output of the amplifiers, and feedback means connected between the summing means and the third and fourth windings of the transformer, said feedback means serving to maintain the total current flow in the amplifiers so that the output from the summing means tends to be zero when the moving element is at a midpoint position between the pickoffs.

9. Electronic circuitry as in claim 8 together with a capacitor connected across at least one of said windings of each of said pickoffs to provide tuned circuits.

References Cited in the file of this patent

UNITED STATES PATENTS

| | | |
|---|---|---|
| 2,153,986 | MacLaren | Apr. 11, 1939 |
| 2,408,524 | Mestag | Oct. 1, 1946 |
| 2,614,163 | Roper | Oct. 14, 1952 |